United States Patent [19]

Phillips et al.

[11] Patent Number: 5,002,312
[45] Date of Patent: Mar. 26, 1991

[54] PRE-IMAGED HIGH RESOLUTION HOT STAMP TRANSFER FOIL, ARTICLE AND METHOD

[75] Inventors: Roger W. Phillips; Kraig R. Willison, both of Santa Rosa, Calif.

[73] Assignee: Flex Products, Inc., Santa Rosa, Calif.

[21] Appl. No.: 453,046

[22] Filed: Dec. 12, 1989

Related U.S. Application Data

[63] Continuation of Ser. No. 189,620, May 3, 1988, abandoned.

[51] Int. Cl.⁵ .............................................. B42D 15/00
[52] U.S. Cl. ....................................... 283/72; 283/75; 283/77; 283/85; 283/904
[58] Field of Search ................... 283/72, 75, 77, 79, 283/83, 84, 85, 86, 904

[56] References Cited

U.S. PATENT DOCUMENTS 4,635,965  1/1987  Vogt ................................. 283/904 X
4,728,377  3/1988  Gallagher ....................... 283/904 X Primary Examiner—Paul A. Bell
Attorney, Agent, or Firm—Flehr, Hohbach, Test, Albritton & Herbert

[57] ABSTRACT

Pre-imaged high resolution transfer foil comprising a carrier having a surface. A releasable hardcoat is disposed on the surface. A vacuum coating is deposited on the hardcoat and an image formed in the vacuum coating.

11 Claims, 1 Drawing Sheet

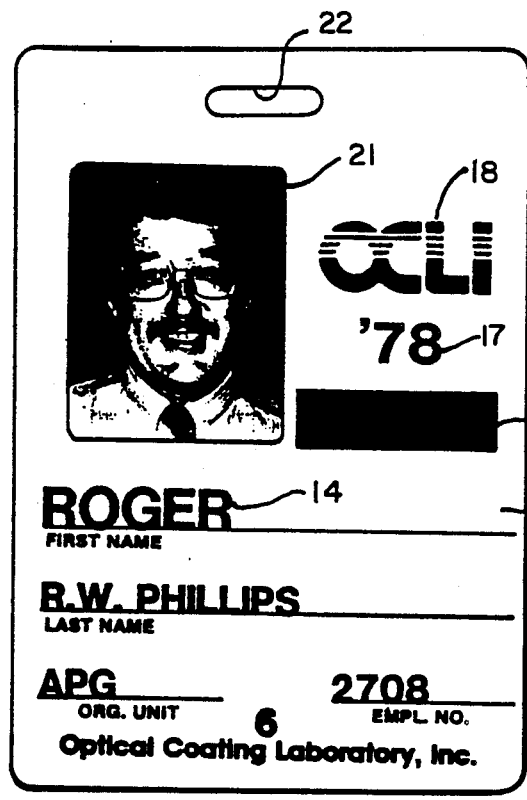
FIG.—1
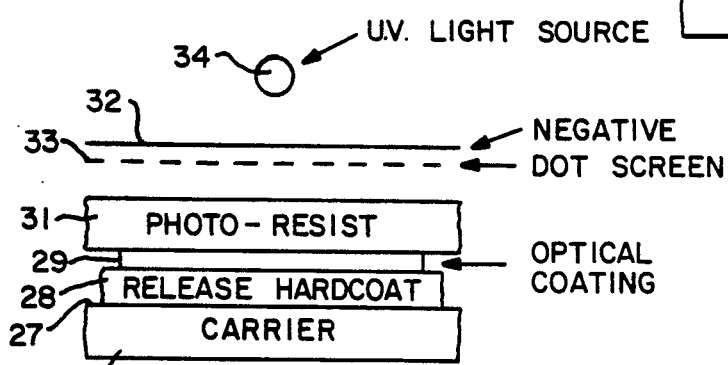
FIG.—2
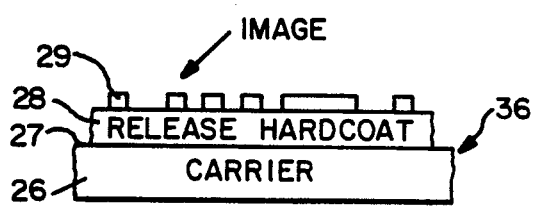
FIG.—3
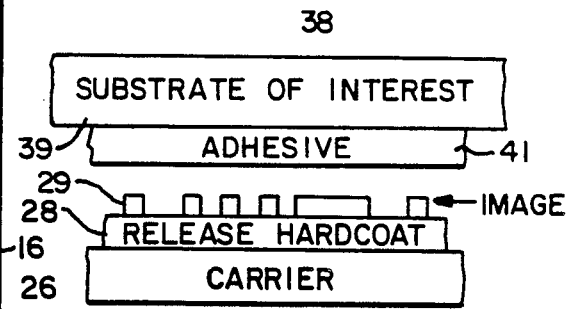
FIG.—4
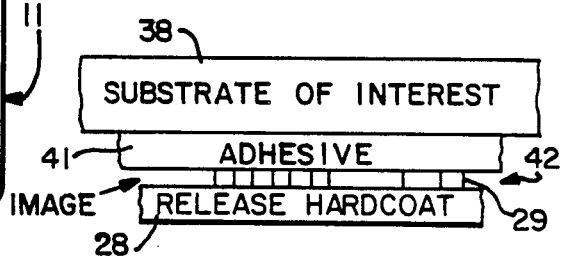
FIG.—5
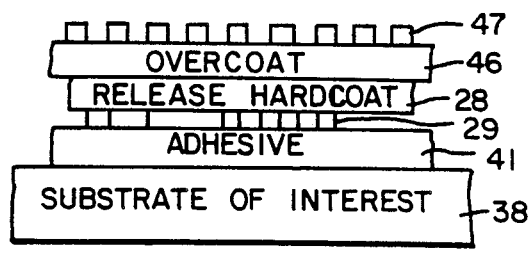
FIG.—6

PRE-IMAGED HIGH RESOLUTION HOT STAMP TRANSFER FOIL, ARTICLE AND METHOD

This is a continuation of application Ser. No. 189,620 filed May 3, 1988 now abandoned.

This invention relates to a pre-imaged high resolution transfer foil, article and method and more particularly to such a pre-imaged high resolution hot stamp transfer foil, article and method which can be utilized with flexible and rigid substrates, as well as transparent and opaque substrates.

Heretofore-hot stamp transfer foils have been provided in conjunction with hot stamp machines to stamp images on to various substrates such as paper, plastic film and even rigid substrates. Typically the image is formed by utilizing a metal die into which the desired image has been cut. This die is placed in the hot stamping machine and is used to press the image into hot stamp foil utilizing a combination of heat and pressure. Typically a heat activated adhesive is placed on the back side of the foil which upon the application of heat becomes tacky in regions of the heated image and adheres to the paper or plastic substrate. The resolution and image which is formed in this manner is on the order of 0.1 mm at best. This is due to the fact that heat introduced during the process spreads out radially through the adhesive and the substrate. If the hot stamping foil carrier substrate is thicker than approximately 48 gauge, the image which is created has edges which are ragged, i.e., the edges are fringed because the radially spreading heat spreads further than the thicker substrate. This phenomenon also occurs if the hardcoat (the release layer) and the adhesive are thick. Thus it is desirable that the substrate as, for example, PET (polyethyleneterephthalate) the adhesive and the hardcoat must be at an optimum thickness. If the PET is too thin it will tear in the hot stamping machine and not survive the vacuum metalizing step. If it is too thick, then the above-described fringing results. If the hardcoat is too thin then the hot stamp foil will not release properly or will not give the transfer image enough scratch and mar protection. If the adhesive is too thin, it will not adhere to the substrate upon which the hot stamping image is being placed. If it is desired to vacuum deposit multi-layer optical coatings where the coating itself is quite thick, the PET must be at least 142 gauge and preferably 200 gauge in thickness. This thickness is required so that the heat load arising from the heat of condensation and from the radiant heat from the evaporating source does not deform the web on which the stamping is being made. Depositing materials such as dielectrics, for example, metal oxides, fluorides, sulfides and the like are particularly prone to wrinkling the web. At the thickness of 142 gauge for PET substantial fringing results in the hot stamped transferred image. This fringe when lightly brushed causes the hot stamped image to flake at the edges of the image. At high production speeds this flaking results in the hot stamping machine becoming contaminated with debris. Furthermore, the image is also subject to flaking phenomenon and is unsightly and unacceptable. There is therefore a need for a new and improved hot stamp transfer foil article and method for making the same.

In general, it is an object of the present invention to provide a pre-imaged high resolution hot stamp transfer foil, article and method.

Another object of the invention is to provide a foil, article and method of the above character in which the image formed is of graphic quality.

Another object of the invention is to provide a foil, article and method of the above character in which the edges of the transferred image are encapsulated to provide an image which is environmentally resistant.

Another object of the invention is to provide a foil, article and method of the above character in which additional levels of security can be provided.

Another object of the invention is to provide a foil, article and method of the above character in which an optically variable device is utilized.

Additional objects and features of the invention will appear from the following description in which the preferred embodiment is set forth in detail in conjunction with the accompanying drawings.

FIG. 1 is a plan view of an article in the form of an employee badge which incorporates the present invention.

FIGS. 2, 3, 4, 5 and 6 are cross-sectional views showing the various steps in the method used for making the foil and an article of the present invention.

In general, the pre-imaged high resolution transfer foil consists of a carrier having a surface, a releasable hardcoat disposed on the surface of the carrier, a vacuum coating disposed on the hardcoat and an image formed in the vacuum coating.

In general the article of the present invention is comprised of a substrate having a surface. An adhesive is disposed on the surface. A vacuum coating is carried by and is secured to the adhesive. An image is formed in the vacuum coating and a protective coat is provided on the vacuum coating. If desired, an overprint can be provided on the protective coat.

In general in the method a carrier film is provided. A releasable hardcoat is deposited on the carrier film, a vacuum coating is then deposited on the releasable hardcoat. A photo-resist is deposited on the vacuum coating and the photo-resist is exposed to an image. The photo-resist is thereafter developed to provide a foil carrying an image. A substrate serving as a carrier film is then provided and an adhesive is provided on the image side of the foil or on the substrate. Heat and pressure is then utilized to transfer the image on the foil to the substrate with the adhesive being disposed between the image and the substrate. After the transfer has been made, the carrier film is removed.

More in particular, the pre-imaged high resolution transfer foil, article and method may now be described in conjunction with FIGS. 1-6. In FIG. 1, there is shown an employee badge or article 11 incorporating the present invention. The employee badge utilizes a substrate 12 formed of a suitable relatively rigid material such as a clear thick polycarbonate. The card as shown is rectangular in form and is provided with a front surface 13 on which there appears conventional printing 14, a stripe 16 indicating the security classification of the employee, a date 17 indicating the date of hire of the employee, a logo 18 of the employer and a patterned optical variable device photograph 21 of the employee made in accordance with the present invention as hereinafter described. The employee badge 11 also is provided with a slot 22 which can be utilized for a strap secured to suitable fastening means such as a clip (not shown) to facilitate wearing of the badge by the employee.

In producing the image or photograph 21 which is shown on the badge 11 the method which is shown in FIGS. 2-6 is utilized.

In accordance with the present invention as shown in FIG. 2, a carrier film 26 formed of a suitable material is provided. The carrier can be of a relatively flexible plastic material as, for example, PET (polyethyleneterephthalate) of a suitable gauge ranging from approximately 40 gauge to 200 gauge. The carrier 26 is provided with a surface 27 upon which there is deposited a release hardcoat layer 28. The release hardcoat 28 can be of any suitable material such as an organic wax, an acrylic type coating having wax components or a silicone type release material, all well known to those skilled in the art. It is merely necessary that the hardcoat layer have integrity during a vacuum coating process hereinafter described and have the capability in connection with a hot stamping process or a transfer roll-on process so that the carrier can be released from the device it carries.

After the release hardcoat layer 28 has been deposited, a layer 29 is deposited which can be characterized as the optical coating which is to receive the image. Typically this optical coating can be in the form of a single metal layer or in the form of a multilayer optical coating. By way of example, the optical coating can be in the form of an optically variable device such as disclosed in co-pending application U.S. Pat. No. 4,705,356. A layer 31 of photoresist is then deposited over the layer 29. The photo-resist can be of a conventional type, and can be either a negative or positive photo-resist. The photo-resist 31 is then exposed to the image to be incorporated into the coating 29. The image is carried by the negative 32. In order to provide improved resolution and to replicate the grey shades in the negative, a dot screen 33 can be utilized if desired. The photo-resist is exposed through the image 32 and the dot screen 33 utilizing ultraviolet light provided by an ultraviolet light source 34. If desired, the dot screen 33 can be utilized for placing hidden messages or other covert features into the design in the coating 29.

After the photo-resist has been exposed, it can be developed by an appropriate developer depending on whether a positive or negative photo-resist is utilized. After the photo-resist is developed to remove certain portions of the photo-resist so that the image is provided in the photo-resist to expose the optical coating 29 therebelow. The assembly which is shown in FIG. 2 is subjected to an etching step by a suitable etchant which can etch the optical coating 29. Typically this can be an acid or alkaline etch or $FeCL_3$ (ferric chloride) in the case of copper etching.

The portion of the optical coating exposed through the photo-resist is then etched away so that the image is carried into the optical coating. After the etching operation has been completed, the remaining photo-resist can be removed in a stripping operation by a suitable photo-resist stripper to provide the assembly shown in FIG. 3 which can be identified as a foil that carries the desired image in the optical coating which is secured to the carrier 26 by the release coat 28.

Let it be assumed that it is now desired to deposit the image carried by the foil 36 into a substrate 38 of interest which is provided with a surface 39 on which it is desired to deposit the image. A coat or layer of adhesive 41 is then placed on the surface 39 of the substrate 38 or alternatively, the adhesive layer 41 can be placed over the optical coating 29 carrying the image. In the drawing the adhesive is shown being deposited on the surface 39. After the adhesive layer 41 has been applied, the carrier carrying the image can then be brought into contact with the substrate 38. Typically this is accomplished by utilizing heat and pressure utilizing a flat die stamp in a reciprocating hot stamping machine or in a roll on transfer process using heated pressure rollers. The time and pressures required for such a step are well known to those skilled in the art. As soon as this transfer has been effected, the carrier 26 can be stripped away so that there remains the article 42 which is comprised of the substrate 38, the adhesive 41 which secures the optical coating 29 to the substrate covered by the release coat 28.

The release hardcoat 28 can be left in place to protect the image. If desired, an additional protective overcoat 46 can be provided. Also printing 47 of a conventional type can then be printed on the overcoat 46.

It has been found that in accordance with the present invention by pre-imaging the hot stamp foil 36 the thickness of the carrier can be increased as well as the thickness of the adhesive and the hardcoat without adversely affecting the quality of the hot stamp image. In fact, the transferred image is of a much higher quality than can be obtained with conventional hot stamping processes. In addition, there are no fringes formed in the image and the image is of graphic quality. Thus it can be seen that the present invention can be readily adapted for use on numerous commercial hot stamp products which are presently on the market such as greeting cards, paperback book covers, decals and consumer items, packaging and the like, none of which at the present time have graphic quality images or pictures thereon.

By utilizing the present invention it has been found that in addition to obtaining a graphic quality image that the image is also encapsulated along the edges by the bonding of the adhesive to the hardcoat outside of the image area which makes the transferred image more environmentally resistant.

When an optical variable coating is utilized for the coating 29, it is possible to use the hot stamp image as a security device. The transferred image not only shifts from one color to another in reflected light as the viewing angle is changed but it also has a shift from a positive to a negative image in going from reflected to transmitted light. In addition, by providing the optically variable thin film coating with a magnetic layer as described in co-pending application Ser. No. 189,779, filed May 3, 1988, a still further security feature can be incorporated into the single image device which greatly enhances the anticounterfeiting capabilities of the device. The device also can incorporate printing. If the printing is of a small size so that it only could be seen under a microscope, another level of security could be provided to provide a total of five security features, three overt and two covert, the photograph, color shift with viewing angle, positive to negative image reversal, magnet, property, and microscopic printing encoded into photograph.

The present invention relates itself to many types of products as hereinbefore described. For example, the invention lends itself to plastic identification cards of the type shown in FIG. 1 and in which an OVD photograph of the person can be incorporated into the card. An optical variable device incorporating the present invention having the high resolution graphics could be used as a seal of authenticity on documents, or for example, on currency. By way of example, the optical variable device could be in the form of a photograph of the president, founder or ruler of the country for that currency. Other security documents such as passports could utilize such optically variable device photographs.

Although the present invention has been described in conjunction with hot stamp foils, it should be appreciated that the method taught herein can be used to apply images directly to optical coatings which are coated directly onto the plastic film. In those situations where the optical coating is deposited directly onto a clear carrier film only the photo-resist coating steps (coating, exposure to UV light and developing) are necessary. If a colored carrier film is used, additional interesting effects can be generated. For example, the color of the carrier film can be adjusted to match one of the colors of the optical variable device so that at a certain angle as, for example, normal viewing, the optically variable device would not be obviously visible as it would blend into the background. At a different viewing angle, however, it would stand out against the background.

In connection with the above it should be appreciated that the substrate of interest 38 can be transparent or opaque. It can be flexible or rigid. Thus six security features can be built into a single device. The color shifter in reflected light, the shift from a positive in reflected light to a negative image in transmitted light, the photograph itself, magnetic qualities with a magnetic layer, microprint images within the OVD and overprinting for the device.

Also it should be appreciated that the present invention can be used by preimaging a hot stamp foil comprised of a thin layer of aluminum deposited on a thin layer, i.e., 48 gauge PET. The 48 gauge material is capable of withstanding the heat when the aluminum is deposited n a vacuum chamber. This construction could be utilized in the embodiment of the invention shown in FIG. 3. The image would be formed only in the aluminum layer and the release hardcoat would be dyed with a solid color. This construction provides a non-shifting colored image on the substrate or carrier.

It is apparent from the foregoing that there has been provided a pre-imaged high resolution transfer of foil, article and method which lends itself to many applications, particularly those where anticounterfeiting is important.

What is claimed is:

1. A pre-imaged high resolution transfer foil comprising a carrier having a surface, a releasable hardcoat disposed on said surface, a vacuum coating deposited on the hardcoat and an etched image of graphic quality formed in the vacuum coating and lying solely in a plane, and having edges within the image with voids therebetween, said edges being encapsulated and free of fractures.

2. A foil as in claim 1 wherein said carrier is in the form of a flexible sheet.

3. A foil as in claim 2 wherein said carrier is formed of PET.

4. A foil as in claim 3 wherein said carrier has a thickness ranging from 40 gauge to 200 gauge.

5. A foil as in claim 1 wherein said vacuum coating is an optically variable device.

6. An article comprising a substrate having a surface, an adhesive deposited on said surface, a vacuum coating secured to the adhesive, an etched image of graphic quality formed in the vacuum coating and lying solely in a plane and having edges within the image with voids therebetween, said edges being encapsulated and free of fractures and a protective coat overlying the vacuum coating.

7. An article as in claim 6 together with overprinting carried on the protective coat.

8. An article as in claim 6 wherein said vacuum coating is an optically variable device.

9. An article as in claim 6 wherein said substrate is formed of plastic.

10. An article as in claim 9 wherein said substrate is transparent.

11. An article as in claim 9 wherein said substrate is opaque.

* * * * *